United States Patent [19]

Gordon et al.

[11] Patent Number: 4,717,345

[45] Date of Patent: Jan. 5, 1988

[54] SOLDERLESS CONNECTOR TECHNIQUE AND APPARATUS

[75] Inventors: Herman B. Gordon; Jeff Cunnane, both of Phoenix, Ariz.

[73] Assignee: Rogers Corporation, Rogers, Conn.

[21] Appl. No.: 898,121

[22] Filed: Aug. 19, 1986

Related U.S. Application Data

[62] Division of Ser. No. 757,741, Jul. 22, 1985, abandoned.

[51] Int. Cl.$^4$ .............................................. H01R 9/09
[52] U.S. Cl. ..................................... 439/67; 439/496; 439/632
[58] Field of Search ............. 339/17 F, 75 M, 75 MP, 339/176 MF; 439/67, 496, 632

[56] References Cited

FOREIGN PATENT DOCUMENTS 700490 12/1953 United Kingdom ........ 339/176 MF

*Primary Examiner*—Neil Abrams
*Attorney, Agent, or Firm*—Fishman & Dionne

[57] ABSTRACT

A solderless connector technique and apparatus is presented for establishing electrical contact between a flexible circuit and another circuit device utilizing relative motion therebetween to wipe away or remove any debris or other foreign matter present on the terminals which could adversely effect electrical contact. In a first embodiment of the present invention, relative motion between the respective circuit devices is provided by male and female housings having a camming device incorporated therein. This camming device will effectively wipe away any foreign matter or debris located on the respective terminal devices. In another embodiment of the present invention, mechanical springs are used to provide lateral motion to the circuit devices thereby wiping away any dirt, dust or debris. Preferably, a means for prewiping i.e., a cleaning pad, is provided to the present invention to facilitate removal of debris.

5 Claims, 11 Drawing Figures

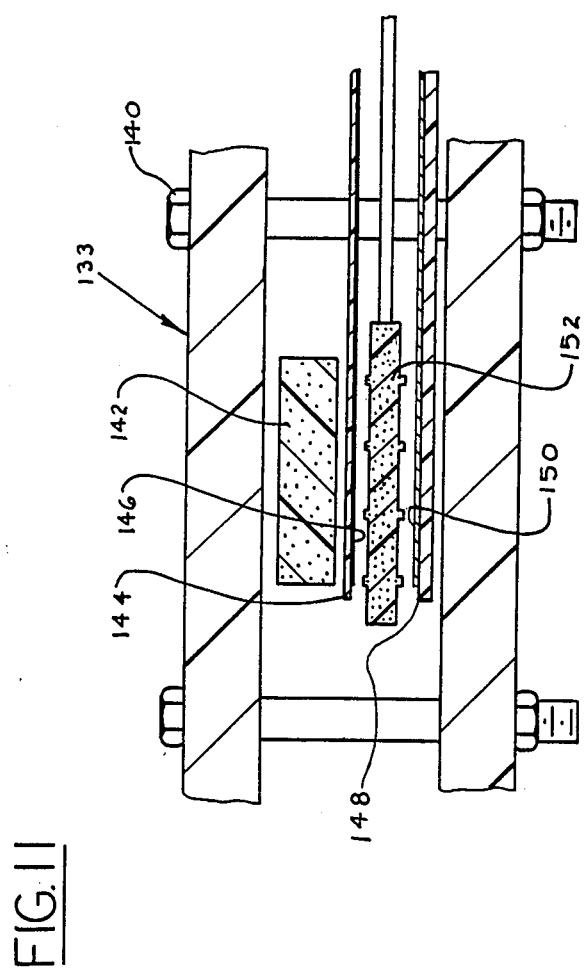

SOLDERLESS CONNECTOR TECHNIQUE AND APPARATUS

This application is a division of application Ser. No. 757,741, filed July 22, 1985, now abandoned.

BACKGROUND OF THE INVENTION

This invention relates to a method and apparatus for interconnecting electrical circuit elements. More particularly, this invention relates to a new and improved solderless connector and method of using the same for establishing electrical contact between a flexible circuit and another circuit device utilizing relative motion therebetween to wipe away any debris or other foreign matter (i.e., corrosive films) which may adversely affect electrical contact.

Conventional methods of interconnecting electrical or electronic circuit components consist of the use of separate connector structures and/or soldering terminals on the components to conductors which deliver current to or from the components. While generally suitable for its intended purposes, interconnecting electrical components via separate connector structures does suffer from certain drawbacks and deficiencies including high manufacturing and purchasing costs as well as increased labor time and costs during installation and connection. Similarly, soldering terminals is undesirable as the substrate which supports an exposed terminal must be able to withstand relatively high temperatures with no adverse effects. Also, soldering connections can be time consuming and therefore be labor intensive and expensive. Another problem with soldered connections is the relative difficulty in disconnecting a soldered terminal during repairs and manufacturing.

In some applications it has been found desirable to replace the use of separate connecting structures and/or soldering as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a solid resilient pressure applicator, such as an elastomeric member, which is placed in compression to bias at least one of the components to be electrically interconnected toward the other component to hold the terminal portions thereof in electrical contact. Such a solderless connection system is disclosed in U.S. Pat. No. 4,468,074, assigned to the assignee hereof and incorporated herein by reference.

U.S. Pat. No. 4,468,074 discloses an apparatus wherein contact portions of a first array of conductive elements are urged against mating contacts of a second array of conductive elements by a pressure applicator comprising a resilient open-celled plastic material thereby establishing and maintaining an electrical connection therebetween. The use of such an open-celled resilient material permits a plurality of closely spaced exposed electrical conductors on or extending from a pair of substrates to be aligned and thereafter reliably pressed together; with the electrical connections being established by a requisite contact pressure applied to the substrates. The solderless connector of U.S. Pat. No. 4,468,074 may be employed to interconnect flexible circuits; to connect flexible circuits to circuits on rigid substrates; to establish connections between the leads extending from integrated circuit in a circuit pattern on a flexible or rigid circuit board; and in other applications.

It is well known that conventional electrical connector devices, such as of the male/female type, utilize mutual or relative sliding motion during the connecting process. This relative motion between the cooperating male and female connectors is desirable as it acts to "wipe" away any debris or foreign matter on the connectors. Such debris may adversely effect electrical contact. While suitable for its intended purposes, the solderless connector of U.S. Pat. No. 4,468,074 will not necessarily provide such relative motion between the flexible circuit and other circuit devices which are to be interconnected. This is because the circuit devices are interconnected when one device is brought down and disposed on another device thereby precluding any lateral movement which would act to wipe away undesirable foreign matter. Consequently, dirt, debris and other foreign matter may still be present on the respective electrical contacts subsequent to interconnection, which may lead to unreliable contacting.

Another area of concern with the "non-wiping" solderless connectors of the type disclosed in U.S. Pat. No. 4,468,074 is the open aging of the circuits before assembly. During exposure to the normal levels of corrosive gases common in air, the metal contact surfaces can corrode, reducing the electrical performance when assembled. As mentioned hereinabove, a typical method for improving the performance of connectors is to provide for a sliding motion between the contacts as they are mated. This sliding action breaks through the non-conductive corrosion layers that may have formed and thus improves the electrical performance of the connector.

SUMMARY OF THE INVENTION

The above discussed and other problems of the prior art are overcome or alleviated by the solderless connection technique and apparatus of the present invention. In accordance with the present invention, a solderless connector is provided for establishing electrical contact between a flexible circuit and another circuit device utilizing relative motion therebetween to wipe away or remove any debris or other foreign matter present on the terminals which could adversely effect electrical contact.

In a first embodiment of the present invention, relative motion between the respective circuit devices is provided by male and female housings having a camming device incorporated therein. This camming device will effectively wipe away any foreign matter or debris located on the respective terminal devices. In another embodiment of the present invention, mechanical springs are used to provide lateral motion to the circuit devices thereby wiping away any dirt, dust or debris.

Preferably, a means for prewiping i.e., a cleaning pad, is provided to the present invention to facilitate removal of debris.

The above discussed and other advantages of the present invention will be apparent to and understood by those skilled in the art from the following detailed description and drawings.

DESCRIPTION OF THE DRAWINGS

Referring now to the drawings wherein like elements are numbered alike in the several FIGURES:

FIG. 11 is cross-sectional elevation view of a second embodiment of a prewiping member in accordance with the present invention.

DESCRIPTION OF THE PREFERRED EMBODIMENT

Figure 1:
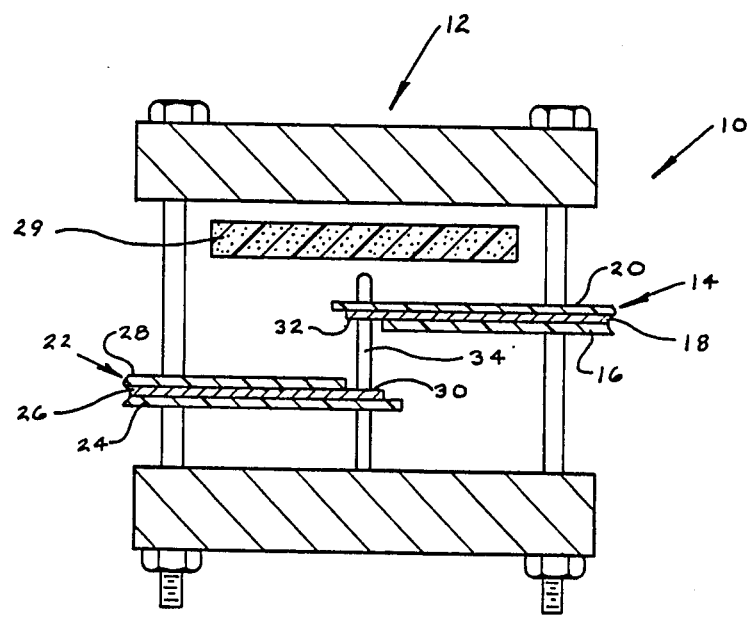
FIG. 1 is a cross-sectional elevation view of a solderless connector in accordance with the prior art.

Referring first to FIG. 1, a solderless connector in accordance with the prior art is shown generally at 10. Solderless connector 10 comprises a clamp frame 12 which is adapted to sandwich a flexible circuit 14 comprising a substrate 16 having a conductor contact area 18 thereon with a protective cover film 20 positioned over the conductive contact area 18, against a flexible circuit 22 which similarly comprises a substrate 24 having a conductive contact area 26 thereon with a protective cover film 28 on the conductive contact area 26. Clamp frame 12 effects reliable electrical contact between the two flexible circuit layers 14 and 22 via the stress transmitted by an elastomeric resilient pad 29. Thus, the mechanical clamp means 12 maintains a certain minimal contact pressure between exposed terminal portions 20 and 32 of conductive contacts 18 and 26, respectively, via the elastomer 28 to effect an electrical connection therebetween. Preferably, at least one alignment post identified at 34 is provided to effect proper alignment between the conductive contacts 18 and 26 of the respective flexible circuits 14 and 22.

While suitable for its intended purposes, the prior art solderless connector of FIG. 1 will not provide any relative motion between the pair of flexible circuits when the exposed terminals portions 30 and 32 are brought into electrical contact. As mentioned hereinabove, this lack of relative sliding motion or "wiping" presents several disadvantages. Thus, for example, debris or other foreign matter present on the terminal portions of the connectors will remain thereon even after electrical interconnection, thereby adversely affecting the reliability of said connection. Also, any corrosive films which may have been formed on the respective terminal portions 30 and 32 will remain on the terminal portion surfaces even after electrical interconnection thereby also having an adverse effect on the reliability of said connection.

Figure 2:
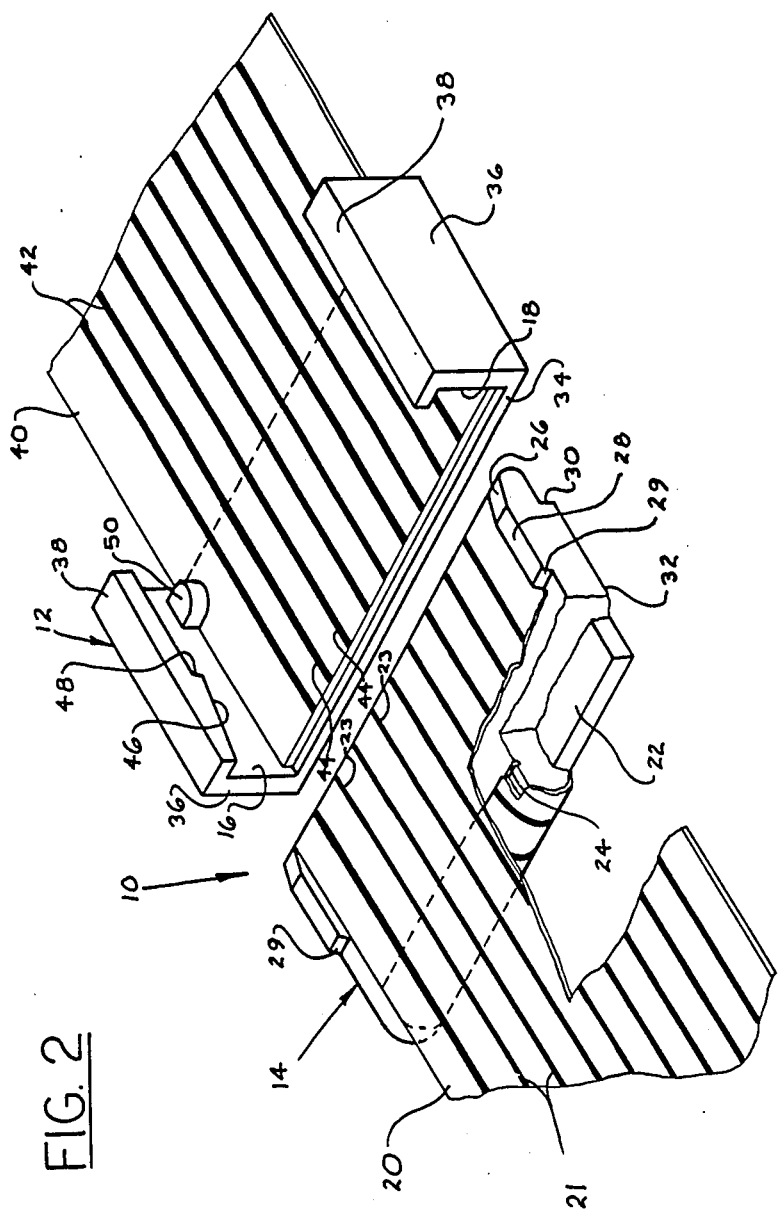
FIG. 2 is a perspective view of a solderless connector prior to connection in accordance with the present invention.
Figure 3:
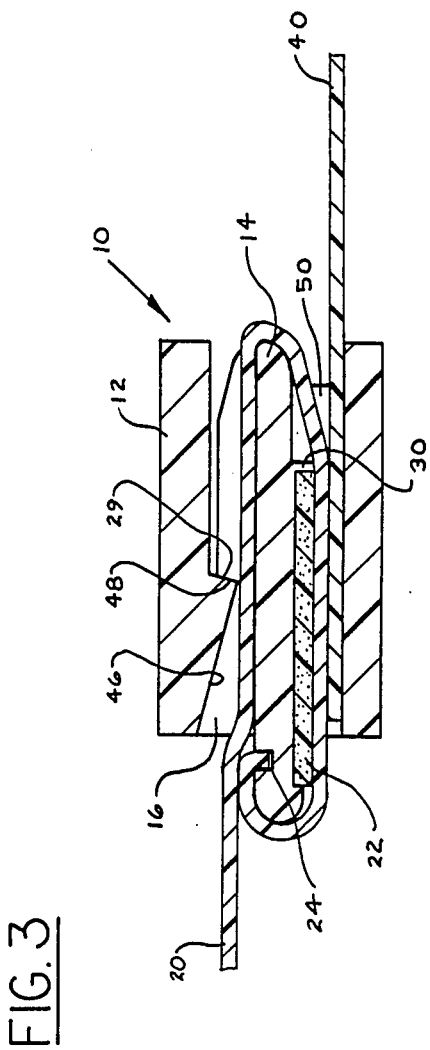
FIG. 3 is a cross-sectional elevation view of the solderless connector of FIG. 2 subsequent to connection.

The above discussed disadvantages associated with the prior art solderless connector of FIG. 1 are overcome or alleviated by the technique for the solderless interconnection of flexible circuits in accordance with the present invention. Turning now to FIGS. 2 and 3, a first embodiment of a solderless connector in accordance with the present invention is shown generally at 10. Solderless connector 10 comprises a female housing 12 which is adapted to receive a male insert 14 via ramps 16 and 18 located on housing 12. Male insert 14 includes a flexible circuit 20 having electrical contacts 21 thereon leading to terminal portions 23 and a resilient elastomeric pad 22. Flexible circuit 20 is wrapped about insert 14 and pad 22 as shown in FIG. 2. It will be appreciated that male insert 14 is comprised of a rigid material such as a suitable plastic material. Flexible circuit 20 is secured to male insert 14 via engaging slot 24 and/or a suitable adhesive. Male insert 14 also includes a leading ramp portion 26 along an upper surface 28 thereof and a shoulder portion 30 along a lower surface 32 thereof. Upper surface 28 of insert 14 further includes a detent 29.

Female housing 12 includes a rigid base 34, sidewalls 36 extending therefrom along with overhanging extensions 38 which define ramps 16 and 18, respectively. Base 34 of housing 12 includes a flexible circuit 40 having electrical contacts 42 thereon leading to a terminal portion 44 thereof. Overhanging extensions 38 each include a ramp 46 which is adapted to engage the ramp 26 of male insert 14. Ramps 46 have a detent 48 which corresponds to the detente 29 on insert 14. Finally, female housing 12 includes stops 50.

During operation, male insert 14 is inserted into female housing 12 along respective ramps 16 and 18. As male insert 14 is inserted, ramps 26 will contact and engage ramps 46 thereby providing a camming action which will act to exert pressure on elastomeric pad 22 and affect electrical contact between the terminal portions 44 of flexible circuit 40 and terminal portions 23 of flexible circuit 20. At a preselected point, stops 50 on female housing 12 will be in abutting relation with shoulders 30 on insert 14 and thereby prevent insert 14 from further entry. Simultaneously, detents 29 and 50 will effect a snap lock which will thereby preclude any further relative movement between flexible circuits 20 and 40.

It will be appreciated that during the insertion of male insert 14 into female housing 12 and the resultant camming action thereof, the respective terminal portions 23 and 44 will undergo lateral or relative motion therebetween. This relative motion will act to wipe away any dust, dirt, films or other foreign debris and thereby insure a reliable electrical connection therebetween.

It will be appreciated that while the FIGS. 2 and 3 embodiments have been shown utilizing the elastomeric member on male insert 14, an elastomeric member could also be positioned on female housing 12 or on both female housing 12 and male insert 14. It will also be appreciated that while female housing 12 has been shown having another flexible circuit provided therein, housing 12 could also be adapted for retaining a rigid printed circuit board or a discrete electronic component.

Figure 4:
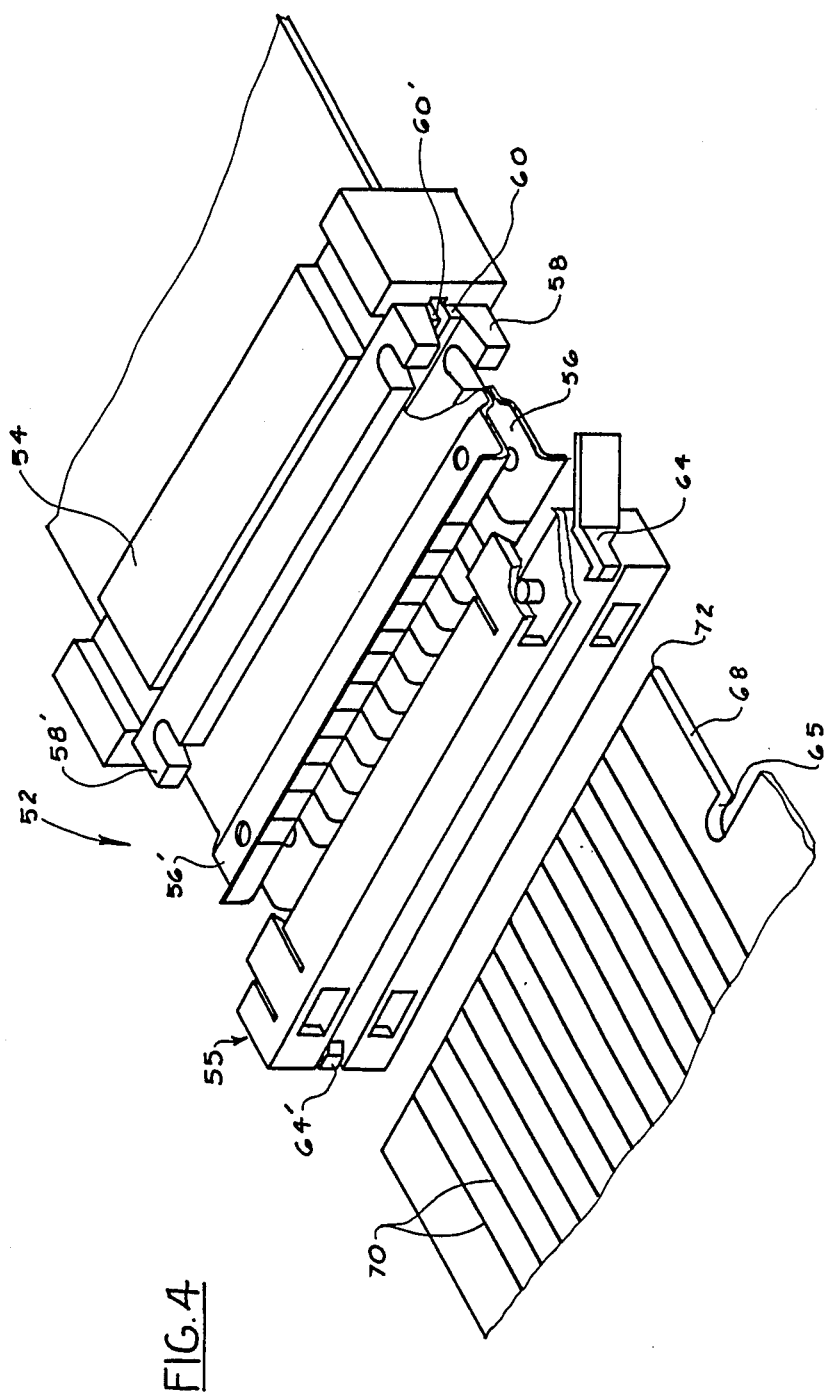
FIG. 4 is an exploded perspective view of another embodiment of a solderless connector in accordance with the present invention.
Figure 5:
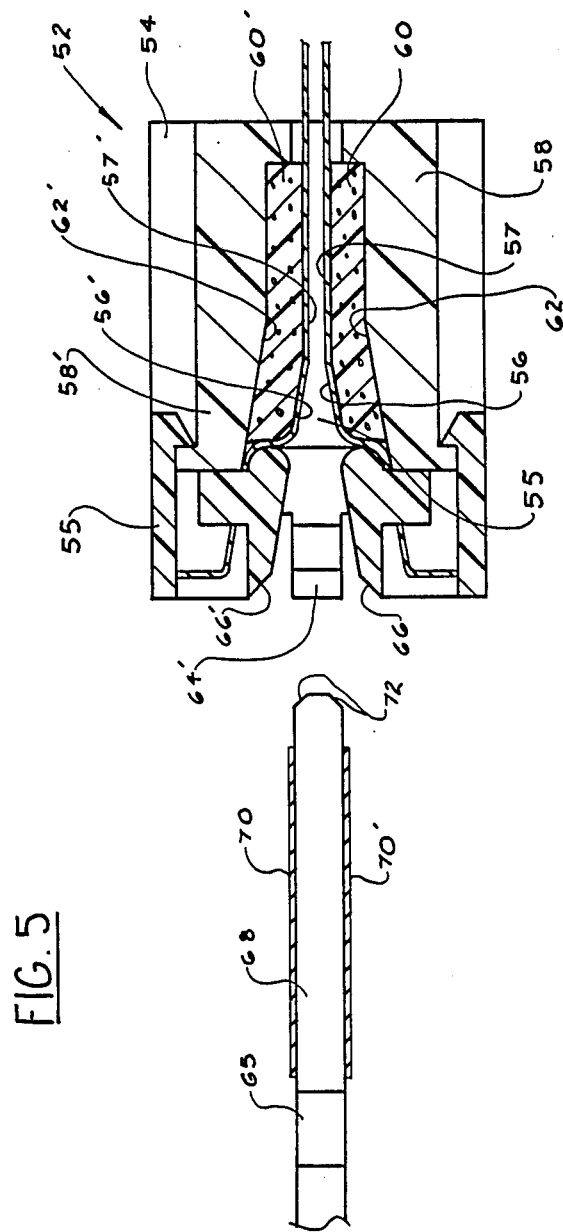
FIG. 5 is an elevation view, partly in cross-section of the solderless connector of FIG. 4.

Referring now to FIGS. 4 and 5, another embodiment of the present invention which is adapted to provide electrical connection to both sides of a printed wiring board is shown generally at 52. Solderless connector 52 comprises a structural housing and bezel structure which, in a preferred embodiment, is mechanically interlocked as in FIG. 4. In FIGS. 4 and 5, structural housing 54 having an opening which communicates with a cavity 55, is provided with a pair of camming structures which are similar to the camming structure 46 of female housing 12 in FIG. 2. Accordingly, a pair of flexible circuits 56 and 56' are respectively wrapped about upper and lower rigid structures 58, 58' to define terminal portions 57 and 57', along with a suitable resilient elastomeric pad 60 and 60'. Rigid structures or moldings 58 and 58' in turn, are provided with inclined surfaces 62 and 62' (similar to ramps 46 of FIG. 2). Bezel structure 55 is provided with a set of guide surfaces 66 and 66' which act to receive and properly orient the rigid printed circuit board 68 and locking detents 64 and 64' to retain printed circuit board 68. Printed circuit board 68, having conductive means 70 and 70' thereon, includes a beveled edge 72. It will be appreciated that beveled edge 72 on circuit board 68 is somewhat analogous to male insert 14 of FIG. 2. Accordingly, when printed circuit board 68 is inserted between guide surfaces 66, 66', beveled edge 72 will oppose the ramped or inclined surfaces 62, 62' of structural housing 54 whereupon elastomeric members 60, 60' will be displaced and thereby exert pressure against the respective electrical terminals and affect electrical contact between terminals 57, 57' and 70, 70', respectively. As in the FIG. 1 embodiment, printed circuit board 68 will be inserted into bezel housing 55 and then into structural housing 54 until the locking detents 64, 64' engage corresponding shoulders of recesses 65 on circuit board 68.

It will be appreciated that during insertion of rigid circuit board 68 into structural housing 54, a camming action will be provided between beveled edge 72 and inclined surfaces 62, 62'. As a result, relative motion will occur between the respective electrical terminals which will act to wipe away any undesirable dirt, films or other foreign debris and thereby effect a reliable connection therebetween.

Figure 6:
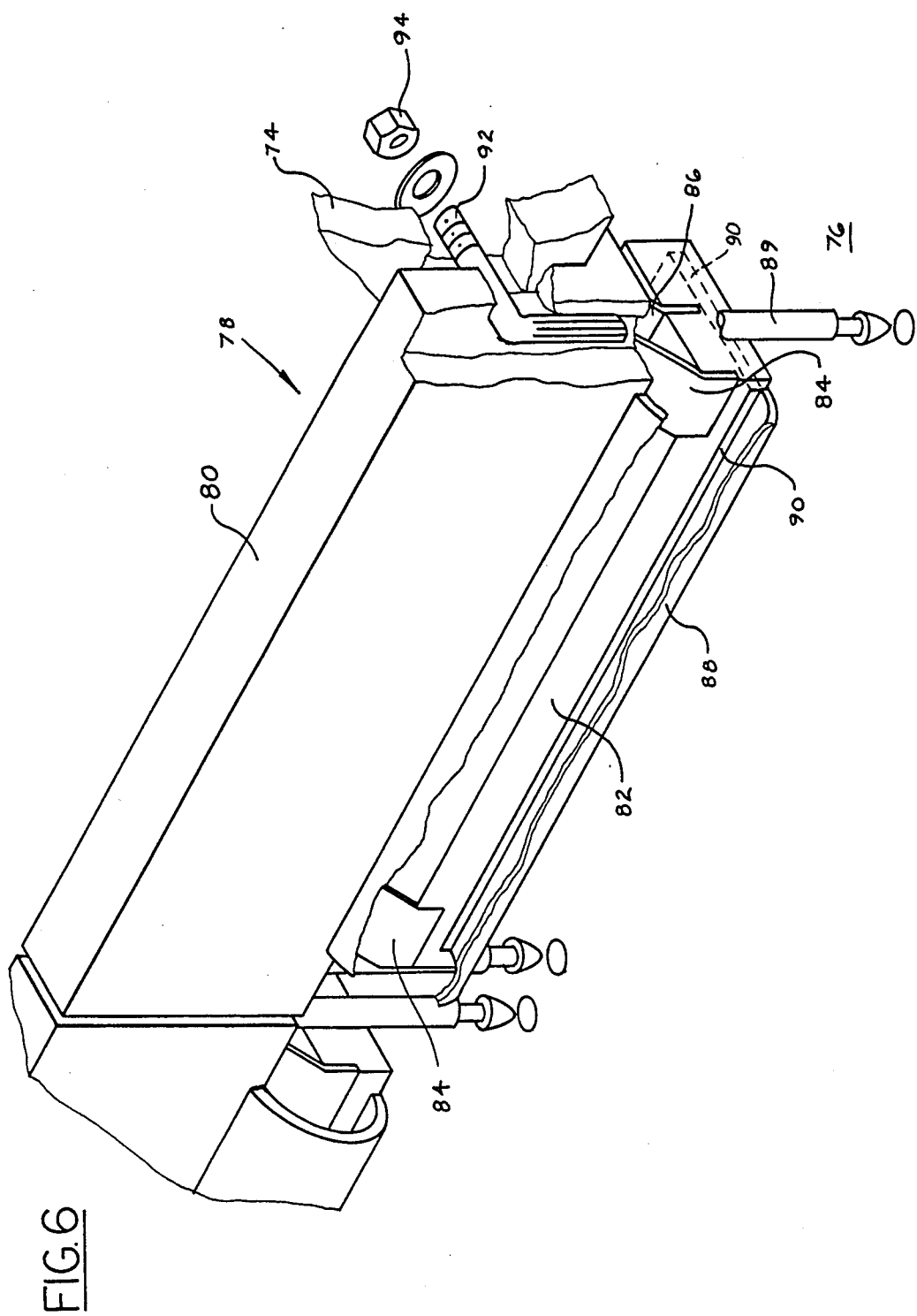
FIG. 6 is a perspective view, partly broken away, of yet another embodiment of a solderless connector in accordance with the present invention.
Figure 7:
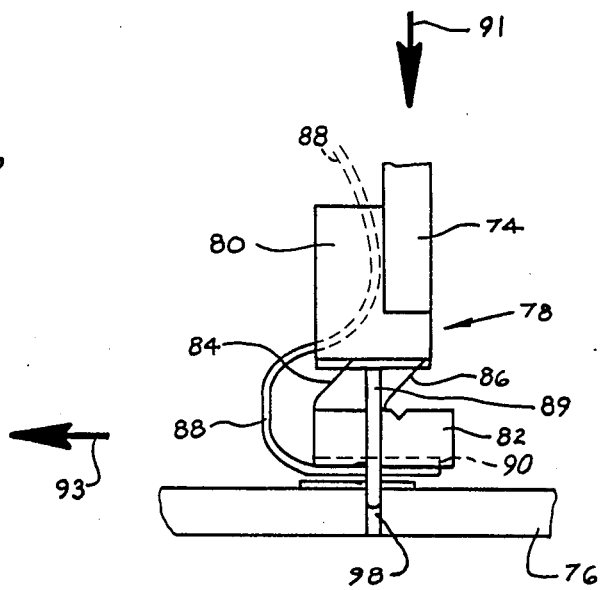
FIG. 7 is a cross-sectional elevation view of the solderless connector of FIG. 6 prior to connection.
Figure 8:
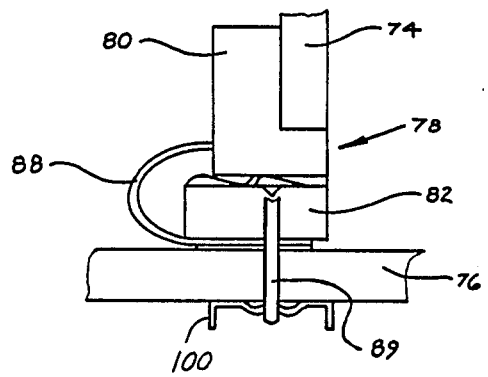
FIG. 8 is a cross-sectional elevation view of the solderless connector of FIG. 6 subsequent to connection.

Turning now to FIGS. 6-8, still another embodiment of the present invention utilizing contact wiping action in a solderless connector is shown. In FIGS. 6-8, a pair of rigid printed circuit boards 74 and 76 oriented at right angles to each other are shown being interconnected by a solderless connector generally identified at 78. Solderless connector 78 comprises a pair of rigid members 80 and 82 interconnected by a pair of leaf springs 84 and 86. A flex circuit 88 electrically interconnects rigid members 80 and 82 while guide pins 89 mechanically interconnect the rigid members therebetween. Each of the rigid members 80 and 82 have a structure which is somewhat analogous to the structure of insert 14 in FIG. 2 in that they comprise a rigid, generally plastic body having an elastomeric pad 90 thereon with flex circuit 88 being wrapped about elastomeric pad 90 and the rigid body so that the circuit contacts are in a facing relationship with corresponding contacts on each of the two circuit boards 74 and 76. Accordingly, when each circuit board 74 and 76 is brought into abutting relation with each respective rigid member 80 and 82, the elastomeric pad will exert pressure and effect a reliable electrical contact between respective contacts on flex circuit 88 and each circuit board 74 and 76. As shown in FIG. 6, guide pin 89 may include a 90° bend therein and have a threaded end 92 which accepts nut 94 and engages rigid circuit board 74 to rigid member 80.

Referring to FIG. 7, during operation of solderless connector 78, upper rigid member 80 is pushed downwardly in the direction indicated by arrow 91 so that leaf springs 84 and 86 are stressed and deformed. As a result, lower rigid member 82 will move in a lateral direction as indicated by arrow 93 causing the respective contacts on flexible circuit 88 and rigid circuit boards 76 to be interconnected. It will be appreciated that as force is exerted downwardly on rigid member 80, leaf springs 84 and 86 will thus provide a sliding action and relative movement between the respective contacts on the flex circuit 88 and circuit board 76 and thereby wipe away any dust, dirt or other foreign debris. Simultaneously, guide pin 89 will align with appropriate openings 98 in circuit board 76 as shown in FIG. 8 (note that rigid member 82 lies between guide pins 89 as shown in FIG. 6). At that point, a cam 100 or other engaging means i.e., nut, may be engaged to hold the leaf springs in tension and preclude any further movement of solderless connector 78. It will be appreciated that as force is exerted on rigid member 82, elastomeric pad 90 therein will provide pressure against flexible circuit 88 which will result in reliable electrical contact between flex circuit 88 and the contacts located on circuit board 76.

Figure 9:
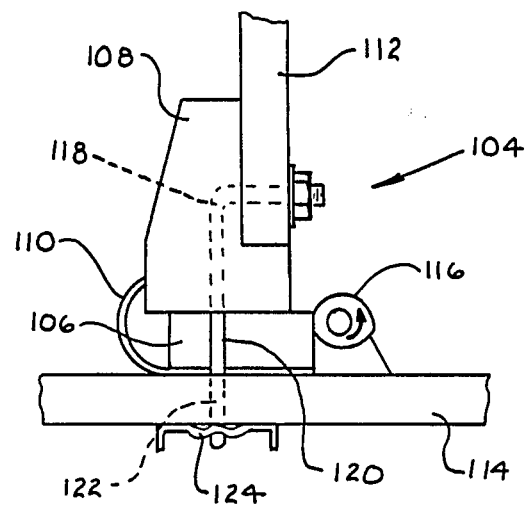
FIG. 9 is a cross-sectional elevation view of still another embodiment of a solderless connector in accordance with the present invention.

In FIG. 9, yet another embodiment of the present invention wherein wiping action is provided between electrical contact is shown generally at 104. Solderless connector 104 has a similar structure to the solderless connector described above in FIGS. 6-8 and includes a lower rigid member 106 and an upper rigid member 108 which are electrically interconnected by a flexible circuit 110. Also like solderless connector 78, solderless connector 104 is shown interconnecting a pair of rigid circuit boards 112 and 114, each being mutually perpendicular to the other. However, unlike the leaf spring actuated slide mechanism of FIGS. 6-8, the embodiment of FIG. 9 utilizes a conventional cam actuated slide mechanism shown at 116. Thus, as cam 116 is rotated in the direction indicated by the arrow, lower rigid member 106 will slide along rigid circuit board 114 thereby providing wiping action between the respective contacts on flex circuit 110 and circuit board 114. At a preselected point, guide pin 118 will engage openings 120 and 122 in lower rigid member 106 and circuit board 114, respectively, thereby precluding any further movement of connector 104. At that point, guide pin 118 may be locked into position by a suitable locking device such as shown at 124. As is shown in the embodiment of FIGS. 6-8, each rigid member 106 and 108 includes an elastomeric pad with the flexible circuit 110 being wrapped therearound and the guide pin 118 providing a sufficient load against elastomeric pad to effect reliable electrical contact between the respective terminals on the flex circuit 110 and both rigid circuit boards 112 and 114.

It should be understood that while solderless connectors 78 and 104 of FIGS. 6 and 9 have been shown interconnecting a pair of mutually perpendicular rigid circuit boards, the solderless connectors may equally be used for interconnecting a flexible circuit to another flexible circuit, another rigid circuit board oriented at a different angle or an electronic component; as well as a pair of perpendicular circuit boards as shown herein.

Figure 10:
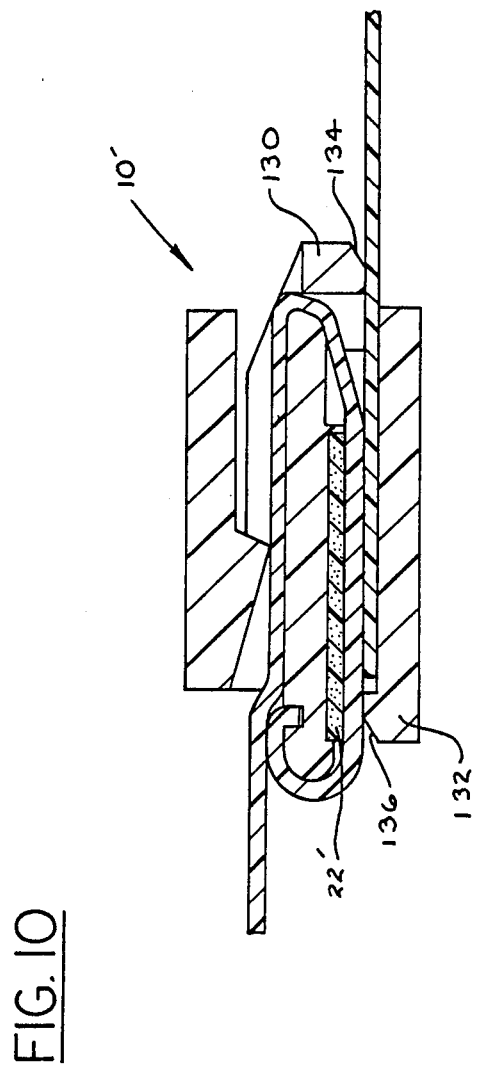
FIG. 10 is a cross-sectional elevation view of a first embodiment of a prewiping member in accordance with the present invention.

In a preferred embodiment of the present invention, separate wiping members i.e., cleaning pads, are provided to the connector bodies so as to effect a preliminary or initial wiping away of foreign debris. Such a separate wiping member is shown in FIG. 10 being mounted on solderless connector 10' as cleaning pads 130 and 132. Solderless connector 10' of FIG. 10 is substantially identical to the solderless connector 10 of FIG. 2 except for the addition of at least one cleaning pad at the leading edge of each connector body which will act to initially wipe away any debris or dirt, especially any dirt having a relatively large size. Preferably, a separate wiping member is provided to preliminarily clean both sets of contacts which are to be interconnected. Such a wiping member may have any suitable configuration such as the rectangular wiping members 130 and 132 of FIG. 10, each having a leading ramp edge 134 and 136.

In FIG. 11, another embodiment of a means for affecting a prewipe in a solderless connector is shown. In FIG. 11 a conventional solderless connector is shown comprising rigid clamp 138 interconnected by a pair of bolts or other connecting means 140 and sandwiching therebetween a resilient elastomeric pad 142, a flexible circuit 144 having electrical circuitry 146 thereon and a rigid printed circuit board 148 having electrical circuits 150 thereon. In this embodiment, a cleaning pad 152 is inserted and withdrawn during the connection process i.e., while a load is being exerted by elastomeric pad 142. In this way, prewiping action will be provided to remove any undesirable debris or other foreign matter. Any suitable means may be used to insert and withdraw cleaning pad 152 including manual or mechanical means.

In accordance with the present invention, several embodiments of solderless connectors have been described which incorporate therein means to provide relative motion between the respective contact surfaces so as to wipe away particles or films on the contact surfaces. Such wiping contacts are especially desirable in those environments such as computer applications wherein paper dust may interfere with electrical contact. Contact wiping action upon engagement as described hereinabove is also well suited to be used in conjunction with a solderless connector of the type described in U.S. Pat. No. 4,468,074. The present invention thus insures reliable electrical contact between a flexible circuit and another flexible circuit, a rigid circuit board, or an electronic circuit device.

In accordance with the present invention, the material which defines the resilient elastomeric pad 22 of FIGS. 2 and 3, 60 and 60' of FIG. 5, 90 of FIG. 6, 22' of FIG. 10 and 142 of FIG. 11 preferably consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is FCD 2200 obtainable from Rogers Corporation. This material is characterized by a compressive load deflection at 25% compression in the range of 5 to 50 psi. A resilient material for use in the present invention is preferably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compression is released and the thickness is measured. The compression set of the FCD 2200 material after 5 hours of steam autoclaving prior to performing test ASTM D-1564 is less than 10%.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. In a solderless connector wherein mechanical means applies force against an elastomeric element to effect electrical contact between terminal portions of circuit devices, at least one of said devices being a flexible circuit device, the improvement comprising:
    means for providing camming action against said elastomeric element wherein said terminal portions of said circuit devices will undergo relative movement during the electrical connection therebetween, wherein said means for providing camming action comprises:
    first and second rigid members, said rigid members being mechanically interconnected by at least one spring means and being electrically interconnected by a flexible circuit interconnecting device, each of said first and second rigid members being adapted to connect with respective first and second rigid or flexible circuit devices;
    an elastomeric pad being positioned between said second rigid member and said flexible circuit interconnection device; and
    wherein force directed onto said first rigid member will be transmitted to said spring means and result in lateral movement between said flexible circuit interconnecting device on said second rigid member and the rigid or flexible circuit device adapted to be connected thereto.

2. The solderless connector of claim 1 wherein:
    said spring means comprise at least one leaf spring.

3. The solderless connector of claim 1 wherein:
    said first and second rigid members are mutually perpendicular.

4. The solderless connector of claim 3 wherein:
    said first and second mutually perpendicular rigid members are adapted to connect with first and second mutually perpendicular rigid circuit devices.

5. The solderless connector of claim 1 including:
    means for aligning and locking said first and second rigid members subsequent to connection between said first and second circuit devices.

* * * * *